United States Patent
Yun et al.

(10) Patent No.: US 8,710,563 B2
(45) Date of Patent: Apr. 29, 2014

(54) IMAGE SENSOR AND METHOD FOR FABRICATING THE SAME

(75) Inventors: Young Je Yun, Yongin-si (KR); Min Sung Kim, Busan (KR)

(73) Assignee: Dongbu Hitek Co., Ltd., Wonmi-Gu, Bucheon-Si, Gyeonggi-Do (KR)

( * ) Notice: Subject to any disclaimer, the term of this patent is extended or adjusted under 35 U.S.C. 154(b) by 89 days.

(21) Appl. No.: 13/542,159

(22) Filed: Jul. 5, 2012

(65) Prior Publication Data

US 2013/0264671 A1 Oct. 10, 2013

(30) Foreign Application Priority Data

Apr. 4, 2012 (KR) .................. 10-2012-0034906

(51) Int. Cl.
*H01L 31/062* (2012.01)
*H01L 31/113* (2006.01)

(52) U.S. Cl.
USPC ............ 257/294; 257/292; 257/293; 257/233

(58) Field of Classification Search
USPC .................. 257/292–294, 233, 234, E33.068, 257/E33.073
See application file for complete search history.

(56) References Cited

U.S. PATENT DOCUMENTS

| | | | | |
|---|---|---|---|---|
| 6,407,415 | B2 * | 6/2002 | Lee | ................................ 257/215 |
| 7,262,072 | B2 * | 8/2007 | Kim | ................................ 438/57 |
| 7,723,147 | B2 | 5/2010 | Yun et al. | |
| 2006/0138497 | A1 * | 6/2006 | Kim | ................................ 257/294 |
| 2008/0157244 | A1 | 7/2008 | Yun et al. | |

FOREIGN PATENT DOCUMENTS

| | | |
|---|---|---|
| KR | 20040058749 | 7/2004 |
| KR | 100835439 B1 | 6/2008 |
| KR | 20090098002 A | 9/2009 |
| KR | 20100057993 A | 6/2010 |

OTHER PUBLICATIONS

Lee Won Ho, Espacenet Bibliographic Data: KR20040058749, Abstract of KR20040058749, Jul. 5, 2004, 1 page, Korea.
Notice of Allowance dated Nov. 28, 2013, Korean Patent Application No. 10-2012-0034906, Korean Intellectual Property Office, Republic of Korea.
Office Action dated May 24, 2013; Korean Patent Application No. 1020120034906.
Yun Young Je; Image Sensor and Formation Method of Image Sensor; English Abstract of KR20090098002; Sep. 17, 2009; http://worldwide.espacenet.com/.
Yun Young Je, et al.; Image Sensor and Method of Manufacturing the Same; English Abstract of KR100835439; Jun. 4, 2008; http://worldwide.espacenet.com/.
Park Jin Ho; Image Sensor and Method for Manufacturing the Image Sensor; English Abstract of KR20100057993; Jun. 3, 2010; http://worldwide.espacenet.com/.

* cited by examiner

*Primary Examiner* — Michelle Mandala
(74) *Attorney, Agent, or Firm* — Murabito, Hao & Barnes LLP; Andrew D. Fortney (57) ABSTRACT

The present invention discloses an image sensor including photodiodes formed in a semiconductor substrate, a color filter array formed over the photodiodes, and microlenses formed on the color filter array. A first microlens, which may be any one of two adjacent microlenses, includes an upper portion and a lower portion. The lower portion of the first microlens is formed of a material different than a material of the upper portion of the first microlens.

13 Claims, 10 Drawing Sheets

IMAGE SENSOR AND METHOD FOR FABRICATING THE SAME

CROSS REFERENCE TO RELATED APPLICATION

This application claims the benefit of the Korean Patent Application No. 10-2012-0034906, filed on Apr. 4, 2012, which is hereby incorporated by reference as if fully set forth herein.

BACKGROUND

1. Field of the Disclosure

Embodiments of the present invention relate to an image sensor and a method for fabricating the same.

2. Discussion of the Related Art

An image sensor is a semiconductor device for converting an optical image to an electric signal. With regard to typical image sensors, there is a CCD (Charge Coupled Device) image sensor and a CMOS (Complementary Metal Oxide Semiconductor) image sensor.

In comparison to the CCD image sensor, the CMOS image sensor has advantages in that a driving system is simple, a variety of scanning systems can be embodied, a signal processing circuit can be integrated into a single chip enabling to make a product smaller, and power consumption is low. In view of such advantages, the CMOS image sensor has many applications, such as DSC (Digital Still Camera), PC Camera, Mobile Camera, and so on.

In the CMOS image sensor, there may be 3T type, 4T type, or 5T type CMOS image sensors according to a number of transistors in a unit pixel. The unit pixel may include one photodiode, and depending on the type, at least one transistor (for example, a transfer transistor, a reset transistor, a select transistor, and a drive transistor).

In general, the image sensor may include a microlens for collecting light, a color filter for filtering the light collected, a photodiode for sensing the light passed through the color filter, and at least one transistor electrically connected to the photodiode.

SUMMARY OF THE DISCLOSURE

Accordingly, the present invention is directed to an image sensor and a method for fabricating the same.

An object of the present invention is to provide an image sensor and a method for fabricating the same, in which distortion or asymmetry of the shape of a microlens (e.g., caused by overlap between adjacent microlenses) is prevented, which improves reliability.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof, as well as the appended drawings.

To achieve these objects and other advantages and in accordance with the purpose of the invention, as embodied and broadly described herein, an image sensor includes photodiodes formed in a semiconductor substrate, a color filter array formed over the photodiodes, and microlenses formed on the color filter array, wherein a first microlens which is either one of two adjacent microlenses, includes an upper portion and a lower portion, and the lower portion of the first microlens is formed of a material different from a material of the upper portion of the first microlens.

In some embodiments, the lower portion of the first microlens may be formed of a material different from a material of the second microlens, which is the other one of the two adjacent microlenses.

The upper portion of the first microlens may be formed of a material that is the same as the material of the second microlens. The first microlens may have a boundary surface between the upper portion and the lower portion positioned higher than a lower side of the second microlens. The second microlens may have a lowest edge in contact with the lower portion of the first microlens.

The image sensor may further include a planarization layer formed between the color filter array and the microlenses. In some embodiments, the lower portion of the first microlens may be a portion of the planarization layer. For example, the planarization layer may include a protruded portion and a recessed portion, wherein the protruded portion may form the lower portion of the microlens, and the recessed portion may have the second microlens positioned thereon. The protruded portion may have a curved outside circumferential surface. The second microlens may have a lowest edge in contact with the outside circumferential surface of the protruded portion. The planarization layer may be formed of a material different from a material of the second microlens.

The image sensor may further include an interlayer insulating film formed between the semiconductor substrate and the color filter array, a wiring layer formed in the interlayer insulating film, and a passivation layer formed between the interlayer insulating film and the color filter array.

In some exemplary embodiments, the recessed portion of the planarization layer may have a thickness of about 0.25 μm to about 0.35 μm, and the protruded portion of the planarization layer may have a thickness of about 0.35 μm to about 0.55 μm.

In another aspect of the present invention, a method for fabricating an image sensor includes the steps of forming one or more photodiodes in a semiconductor substrate, forming one or more color filters corresponding to the photodiodes, forming a planarization layer on the color filters, forming a reflowed first photoresist pattern on the planarization layer corresponding to any one of adjacent color filters, forming a first microlens by etching the planarization layer using the reflowed first photoresist pattern as a mask, and forming a second microlens on an etched portion of the planarization layer.

The step of forming a first microlens by etching the planarization layer using the reflowed first photoresist pattern as a mask may further include the step of forming a protruded portion in the planarization layer positioned under the reflowed first photoresist pattern, and a recessed portion in the planarization layer exposed from the reflowed first photoresist pattern. The step of forming a protruded portion may comprise forming a curved outside circumferential surface of the protruded portion.

The step of forming a second microlens on an etched portion of the planarization layer may comprise forming a second photoresist pattern on the recessed portion of the planarization layer, and forming the second microlens by reflowing the second photoresist pattern.

The method may further include the steps of forming an interlayer insulating film including a wiring layer between the semiconductor substrate and the color filters, and forming a passivation layer between the interlayer insulating film and the color filters.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION

Reference will now be made in detail to specific embodiments of the present invention, examples of which are illustrated in the accompanying drawings. In the description, if it is described that a layer (e.g., a film), a region, a pattern, or a structure is formed "on" or "under" a substrate, a layer (a film), a region, a pad, or a pattern, the terms "on", or "under" imply that the layer (the film), the region, the pattern, or the structure is formed "on" or "under" the substrate, the layer (the film), the region, the pad, or the pattern either directly, or indirectly with another substrate, layer (film), region, pad, pattern, or other structure or feature disposed therebetween. Furthermore, a reference to the "on" or "under" is shown in the corresponding drawing(s).

The size of structures in a drawing may be exaggerated, and/or structures may be omitted or shown schematically for convenience or clarity of description. In addition, a size of an element or feature may not be shown to scale. Wherever possible, the same reference numbers will be used throughout the drawings to refer to the same or like parts. An image sensor and a method for fabricating the same in accordance with embodiments of the present invention will be described with reference to attached drawings.

Figure 1:
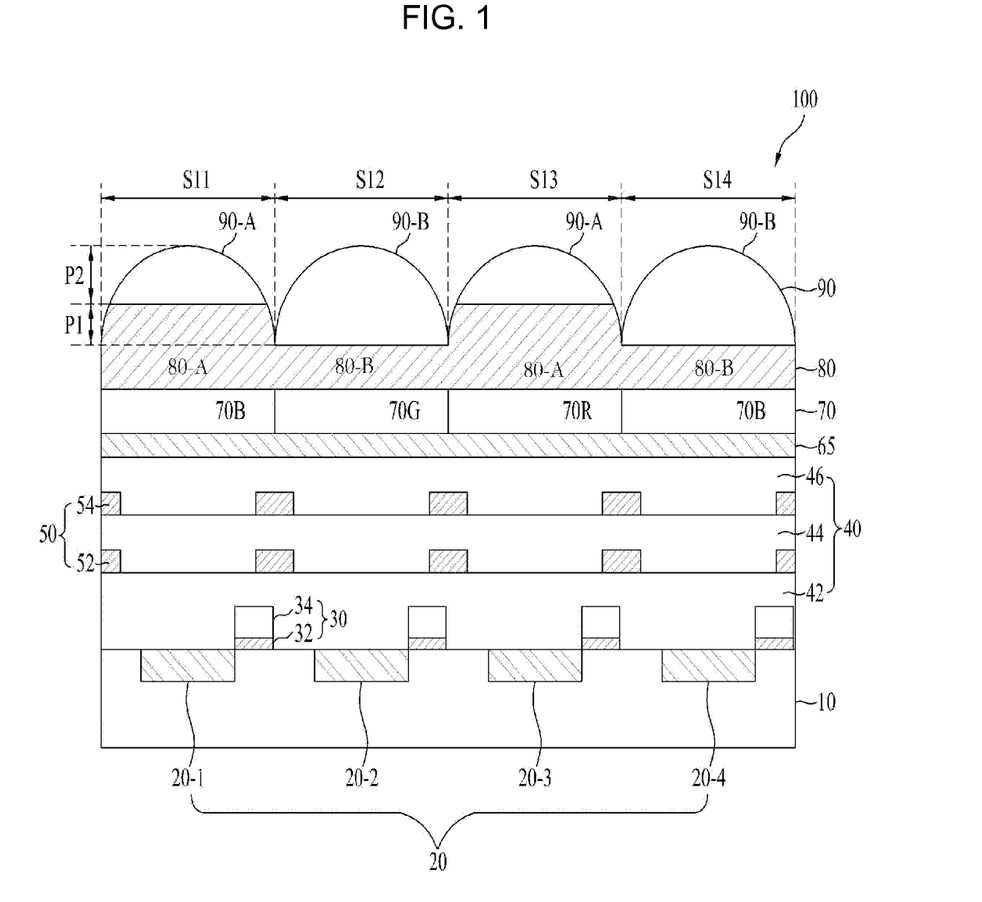
FIG. 1 illustrates a section of an image sensor in accordance with a preferred embodiment of the present invention.
Figure 12:
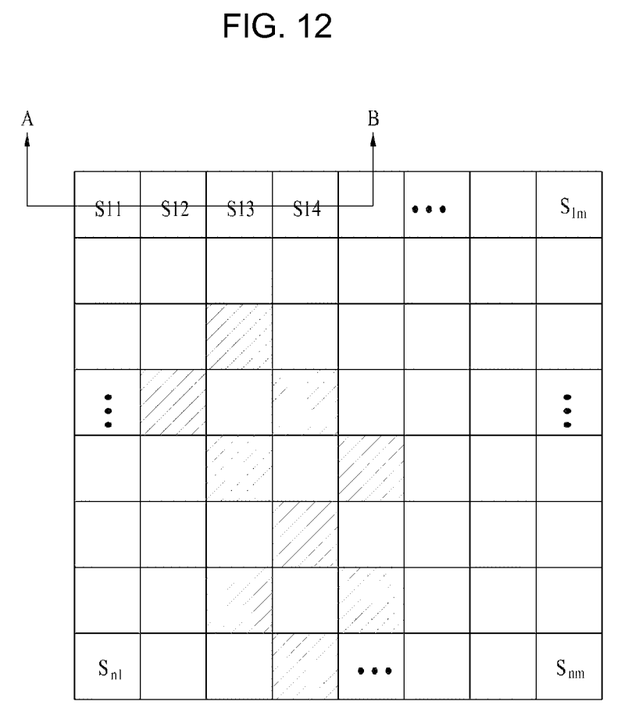
FIG. 12 illustrates a top view of a pixel region of the image sensor in accordance with an exemplary embodiment of the present invention.

FIG. 1 illustrates a section of an image sensor 100 in accordance with embodiments of the present invention. The image sensor 100 may include a pixel region for sensing a light. For example, FIG. 12 illustrates a pixel region of the image sensor in accordance with embodiments. FIG. 1 illustrates an AB direction section of the pixel region shown in FIG. 12, to show a portion of the pixel region of the image sensor 100.

The image sensor 100 includes a substrate 10, a photodiode 20, a gate electrode 30, an interlayer insulating layer 40, a wiring layer 50, a passivation layer 65, a color filter array 70, a planarization layer 80, and a microlens 90.

Referring to FIG. 12, the pixel region of the image sensor 100 may be divided into a plurality of unit pixel regions, S11 to Snm (where n and m are natural numbers larger than 1).

The substrate 10 may be a semiconductor substrate (e.g., a monocrystalline or polycrystalline silicon substrate), and in some embodiments, the semiconductor substrate may be doped with P-type impurities or N-type impurities. The substrate 10 may have an isolation layer (not shown) for isolating an active region from an isolation region.

The photodiode 20 is provided in the substrate 10 corresponding to the unit pixel region S11 to Snm (where n and m are natural numbers larger than 1). For example, the photodiode 20 may be provided at the active region of the substrate 10. Each of the unit pixel regions S11 to Snm (where n and m are natural numbers larger than 1) may be the smallest single element which is capable of sensing light and is controllable.

Figure 11:
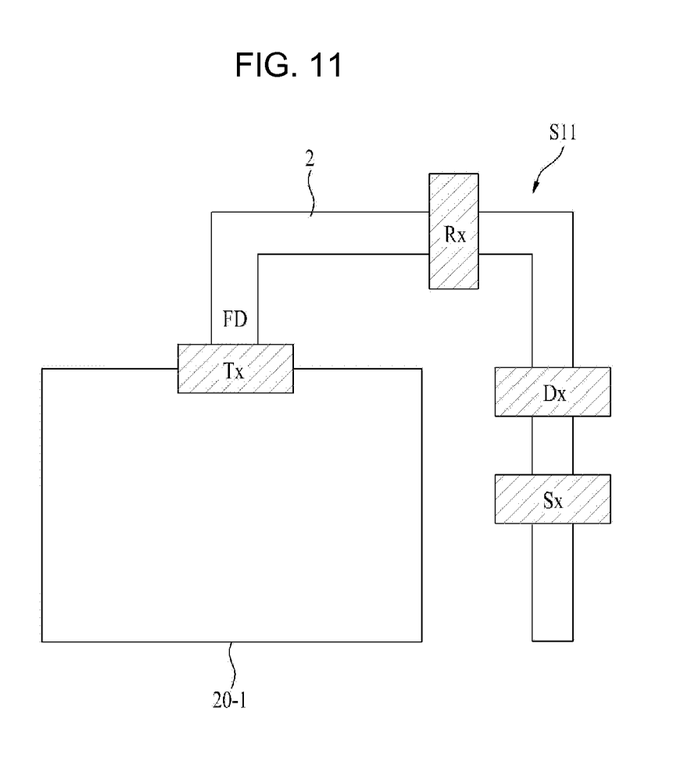
FIG. 11 illustrates a diagram of a unit pixel of the image sensor shown in FIG. 1 in accordance with an exemplary embodiment of the present invention.

FIG. 11 illustrates a diagram of a unit pixel (e.g., S11 of FIG. 12) of the image sensor 100 shown in FIG. 1. Referring to FIG. 11, the unit pixel S11 may include a photodiode 20-1, a transfer transistor Tx, a reset transistor Rx, a drive transistor Dx, and a select transistor Sx. The photodiode 20-1 may be provided at the active region 2 of the substrate 10 positioned on one side of the transfer transistor Tx, and a floating diffusion region FD may be provided at the active region 2 of the substrate 10 positioned one the other side of the transfer transistor Tx.

Referring now to FIG. 1 and FIG. 11, the gate electrode 30 is provided on the substrate 10. In this instance, the gate electrode 30 may be a gate electrode of the transistor Tx, Rx, Dx, or Sx of the unit pixel S11 of the image sensor 100. For example, the gate electrode 30 shown in FIG. 1 may be a gate electrode of the transfer electrode Tx. The gate electrode 30 may include a gate oxide film 32 and a silicon gate 34. However, the invention is not limited as such. On the contrary, the gate electrode may include a gate conductive layer having a single layer structure or a multi-layer structure comprising any conductive or semiconductive material known in the art (e.g., polysilicon, a metal or metal alloy such as tungsten, and/or a metal silicide, etc.), and a gate insulating layer comprising any suitable insulating material known in the art (e.g., silicon dioxide, $SiO_2$ doped with F or B and/or P, silicon nitride, combinations thereof, etc.). In some embodiments, the gate electrode may have a single layer structure or a multi-layer structure comprising polysilicon, a metal such as tungsten, and/or a metal silicide. There may be a source region and a drain region (not shown) provided at the active region on opposite sides of the gate electrode of each of the transistors Tx, Rx, Dx, and Sx.

The interlayer insulating layer 40 is on the substrate 10 having the photodiode 20 and the gate electrode 30 thereon. The wiring layer 50 is in or on the interlayer insulating layer 40. The wiring layer 50 may be configured or arranged so that the wiring layer 50 does not shade the light incident on the photodiode 20. For example, the wiring layer 50 may be configured or arranged so that it does not overlap with the unit pixel regions, but overlaps with boundary regions between the unit pixel regions S11 to Snm (see FIG. 11).

The interlayer insulating layer 40 may comprise any suitable insulating material known in the art. For example, in exemplary embodiments, the interlayer insulating layer 40 may comprise an oxide (e.g., silicon dioxide), a nitride (e.g., silicon nitride), or a combination thereof (e.g., a nitride-on-oxide bilayer, an oxide-nitride-oxide stack, or fluorosilicate glass [FSG] on a thin layer of silicon nitride etc.). In some implementations, the interlayer insulating layer 40 may have a plurality of layers (e.g., 42, 44, and 46). For example, the interlayer insulating layer 40 may include a first interlayer insulating layer 42, a second interlayer insulating layer 44, and a third interlayer insulating layer 46.

The first interlayer insulating layer 42 may be on the substrate 10 in contact with the photodiode 20 and the gate electrode 30. The second interlayer insulating layer 44 may be on the first interlayer insulating layer 42, and the third interlayer insulating layer 46 may be on the second interlayer insulating layer 44.

In such embodiments, each of the first, second, and third interlayer insulating layers 42, 44, and 46, respectively, may comprise or consist essentially of an oxide layer (e.g., a silicon dioxide, which may be doped with [i] fluorine or [ii] boron and/or phosphorous, and formed by chemical vapor deposition from a silicon source such as silane or tetraethylorthosilicate [TEOS] and an oxygen source such as dioxygen [$O_2$] or ozone [$O_3$], etc.), but the disclosure is not limited thereto. The insulation layer(s) may further comprise a nitride (e.g., silicon nitride), an oxynitride (e.g., silicon oxynitride) or oxycarbide (e.g., SiOC or SiOCH), or any other suitable insulating material known in the art.

In some embodiments, the first, second, and third interlayer insulating layers 42, 44, and 46, respectively, may comprise the same material(s) and/or may have the same thickness(es). However, the invention is not limited as such, and each of the first, second, and third insulating layers may also comprise different materials and/or have different thicknesses.

The wiring layer 50 may have a plurality of layers (for example, 52 and 54) having a multilayer structure in a vertical direction. Any one of the plurality of layers (e.g., 52 and/or 54) may be provided in any one of the plurality of the interlayer insulating layers 42, 44, and 46. For example, the wiring layer 50 may include a first wiring layer 52 and a second wiring layer 54 wherein the first wiring layer 52 may be provided in the second interlayer insulating layer 44, and the second wiring layer 54 may be provided in the third interlayer insulating layer 46.

The wiring layer(s) 50 may comprise one or more metal or conductive wires, which may be connected to each other via one or more metal contacts. In some embodiments, the wiring layer(s) 50 may comprise one or more semiconductive wires. In exemplary embodiments, the wiring layer 50 comprises one or more metal layers each of which may include aluminum or an alloy thereof with copper, titanium, silicon, etc., or any other suitable metal known in the art. In an alternate embodiment, the wiring layer 50 may comprise copper damascene or dual damascene metal.

In some embodiments, the passivation layer 65 is on the interlayer insulating layer 40. The passivation layer 65 may comprise any suitable insulating material discussed herein (e.g., an oxide, nitride, oxynitride, oxycarbide, a combination thereof, or any other insulating material known in the art). In some exemplary embodiments, the passivation layer 65 may comprise or consist essentially of a nitride (for example, SiN).

The color filter array 70 is on the passivation layer 65 and generally corresponds to the photodiode 20. The color filter array 70 may include a plurality of color filters, for example, a blue color filter 70B, a green color filter 70G, and a red color filter 70R. The blue color filter 70B, the green color filter 70G, and the red color filter 70R may have thicknesses that are different from one another, or in the alternative, they may have the same thickness. Each of the color filters 70B, 70G, and 70R may be configured on the passivation layer 65 to correspond to and/or aligned with one of the photodiodes 20.

For example, in one embodiment, the blue color filter 70B may be aligned with the first photodiode 20-1 or the fourth photodiode 20-4, the red color filter 70R may be aligned with the second photodiode 20-2, and the green color filter 70G may be aligned with the third photodiode 20-3.

In exemplary embodiments, the planarization layer 80 is on the color filter array 70, and protects the color filter array 70 against moisture and scratching.

The planarization layer 80 may have a first portion 80-A (hereafter, the "first portion of the planarization layer") in which an upper side is positioned higher than an upper side of a second portion 80-B (hereafter the "second portion of the planarization layer"). Consequently, as shown in FIG. 1, the first portion 80-A of the planarization layer has a thickness that is greater than the thickness of the second portion 80-B of the planarization layer 80.

In some embodiments, the first portion 80-A of the planarization layer 80 may be a region corresponding to any one of the unit pixel regions adjacent to each other (e.g., S11 and/or S13), and the second portion 80-B of the planarization layer 80 may be a region corresponding to the other one of the unit pixel regions adjacent to each other (e.g., S12 and/or S14). In other embodiments, the first portion 80-A of the planarization layer 80 may be a region corresponding to any one of two color filters adjacent to each other (e.g., 70B and/or 70R), and the second portion 80-B of the planarization layer 80 may be a region corresponding to the other one of the two color filters adjacent to each other (e.g., 70G and/or 70B). The first and second portions of the planarization layer, 80-A and 80-B respectively, are discussed in further detail herein with regard to FIG. 2.

Figure 2:
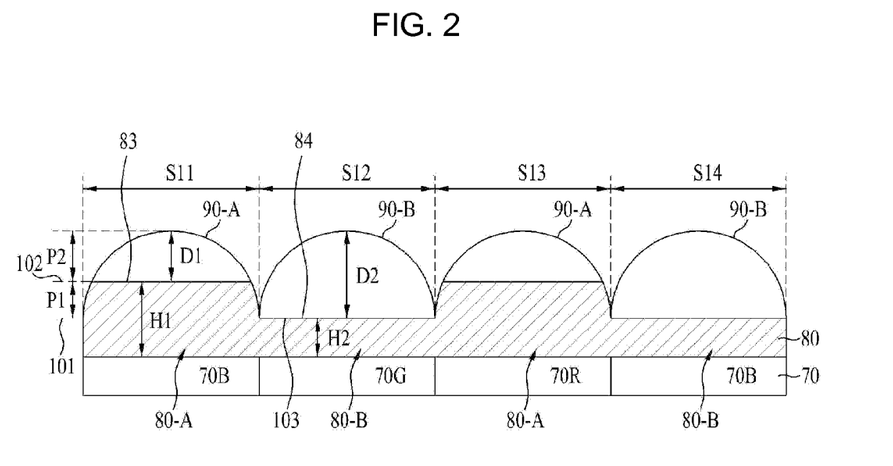
FIG. 2 illustrates a partial enlarged view of the color filter array, the planarization layer, and the microlens shown in FIG. 1.

FIG. 2 illustrates a partial enlarged view of the color filter array 70, the planarization layer 80, and the microlens 90 shown in FIG. 1.

The unit pixel regions S11 to Snm of the image sensor 100 may be arranged in the form of a matrix, with adjacent two-unit pixel regions (for example, S11 and S12) included in a column or a row of the matrix (see, e.g., FIG. 12).

The microlens 90 may be on the planarization layer 80, and may correspond to the color filter array 70. In other implementations, the microlens 90 may be on the planarization layer 80, and may correspond to each of the unit pixel regions S11 to Snm. The microlens 90 may have, but is not limited to, a convex curved surface (e.g., a semi-sphere) for collecting the light. On the contrary the microlens 90 may have any suitable shape known in the art capable of collecting light.

In some embodiments, the microlens 90 may include one or more first microlenses (for example, 90-A) corresponding to any one (for example, S11) of two adjacent unit pixels (for example, S11 and S12), and a second microlens (for example, 90-B) corresponding to the other one (for example, S12) of the two adjacent unit pixels (for example, S11 and S12), in the matrix. Additionally or alternatively, the microlens 90 may include a first microlens (for example, 90-A) corresponding to any one 70B of two adjacent color filters (for example, 70B and 70G), and a second microlens (for example, 90-B) corresponding to the other one (For an example, 70G) of the two adjacent color filters (for example, 70B and 70G).

Regarding the height of the microlenses, in some embodiments, the first microlens 90-A may be divided into a lower portion P1 and an upper portion P2. A boundary 102 of the upper portion P2 and the lower portion P1 may be substantially parallel to a lowest side 101 of the first microlens 90-A.

The microlenses 90-A/90-B may be formed from any microlens material known in the art, for example, a resist or an oxide (TEOS, etc.).

The lower portion P1 and the upper portion P2 of the first microlens 90-A may be formed of materials different from each other, and in some variations, the upper portion P2 of the first microlens 90-A may be formed of a material that is the same as a material of the second microlens 90-B. In some embodiments, the lower portion P1 of the first microlens 90-A may be formed of a material different from a material of the second microlens 90-B adjacent thereto. For example, in one exemplary embodiment, the lower portion P1 of the first microlens 90-A may be formed of silicon nitride film and the second microlens 90-B may be formed of photoresist or any other photosensitive material known in the art.

In other embodiments, the lower portion P1 of the first microlens 90-A and the second microlens 90-B may be formed of different kinds of photoresist. For example, the lower portion P1 of the first microlens 90-A may be formed of CT-2010L, and the second microlens 90-B may be formed of TMR-P18.

The boundary surface 83 of the upper portion P2 and the lower portion P1 of the first microlens 90-A may be positioned higher than a lower side 84 of the second microlens 90-B. And, the second microlens 90-B may have a lowest edge in contact with the lower portion P1 of the first microlens 90-A.

In some variations, as shown in FIGS. 1 and 2, the lower portion P1 of the first microlens 90-A may comprise a portion of the planarization layer 80, but the invention is not limited as such. On the contrary, the first microlens 90-A may be formed of a material different from the planarization layer 80, and may comprise any suitable material known in the art. However, the exemplary embodiment described herein is one in which the lower portion P1 of the first microlens 90-A is a portion of the planarization layer 80.

As previously described above, the planarization layer 80 may include a first portion 80-A and a second portion 80-B.

In some embodiments, the first portion 80-A may be a region corresponding to, and overlapping with one S11 of the two adjacent unit pixel regions S11 and S12, and the second portion 80-B may be a region corresponding to, and overlap with the other one S12 of the two adjacent unit pixel regions S11 and S12. Additionally or alternatively, the first portion 80-A may be a region corresponding to, and overlapping with one (for example, 70B) of the two adjacent color filters (for example, 70B and 70G), and the second portion 80-B may be a region corresponding to, and overlap with the other one (for example, 70G) of the two adjacent color filters (for example, 70B and 70G).

In general, if the blue color filter 70B, the green color filter 70G, and the red color filter 70R have thicknesses different from one another, the planarization layer 80 provides a flat surface for forming the microlens 90. However, in order to prevent deformation of the microlens caused by overlap of the adjacent microlenses from taking place at the time of formation of the microlens 90, embodiments of the present invention provide a step between the first portion 80-A and the second portion 80-B of the planarization layer 80.

That is, the first portion 80-A of the planarization layer 80 may include a protruded portion (hereinafter a "protruded portion of the planarization layer"). The second portion 80-B of the planarization layer 80 may include a recessed portion (hereinafter a "recessed portion of the planarization layer"). The protruded portion of the planarization layer 80 is a portion protruded with reference to the recessed portion of the planarization layer 80, and in some implementations, there may be a step between the two.

The first portion 80-A and the second portion 80-B of the planarization layer 80 may be, but are not limited to, a circular, elliptical, or polygonal shape if viewed from above. On the contrary, the first portion 80-A and the second portion 80-B of the planarization layer 80 may have any suitable shape known in the art. In some embodiments, the first portion 80-A of the planarization layer 80 may have a thickness of about 0.35 μm to about 0.55 μm (or any value or range of values therein), and the second portion 80-B may have a thickness of about 0.25 μm to about 0.35 μm (or any value or range of values therein).

In some exemplary embodiments, and as shown in FIG. 2, the first microlens 90-A may include the protruded portion P1 of the planarization layer 80 and the upper portion P2 of the first microlens, and the second microlens 90-B may be positioned in the recessed portion of the planarization layer 80. The upper portion P2 of the first microlens 90-A and the second microlens 90-B may be formed of the same material, and in some embodiments, the planarization layer 80 may be formed of a material different from the second microlens 90-B. For example, in one exemplary embodiment, the planarization layer 80 may comprise a silicon nitride film, and the second microlens 90-B may be formed of a photoresist material. In another embodiment, the planarization layer 80 and the second microlens 90-B may be formed of different kinds of photoresist material. For example, the planarization layer 80 may be formed of CT-2010L, and the second microlens 90-B may be formed of TMR-P18.

A first boundary surface 83 between the first portion 80-A of the planarization layer 80 and the upper portion P2 of the first microlens 90-A may have a height different from a height of the second boundary surface 84 between the second portion 80-B of the planarization layer 80 and the second microlens 90-B. For example, the second boundary surface 84 may be positioned lower than the first boundary surface 83, such that the height H2 (or thickness) of the second portion 80-B of the planarization layer may be less than the height H1 (or thickness) of the first portion 80-A of the planarization layer (e.g., H2<H1). Therefore, though a lowest edge of the second microlens 90-B may be in contact with a side of the protruded portion P1 of the first portion 80-A of the first microlens 90-A, a lowest edge of the second microlens 90-B is not in contact with a side of the upper portion P2 of the first microlens 90-A.

In some exemplary embodiments, both the first microlens 90-A and the second microlens 90-B may have a convex lens shape. Therefore, not only the upper portion P2 of the first microlens 90-A may have a curved outside circumferential surface, but also the protruded portion P1 of the first portion 80-A of the planarization layer 80 may have a curved outside circumferential surface. That is, the protruded portion P1 of the planarization layer 80 may have a rounded outside circumferential surface.

The outside circumferential surface of the upper portion P2 of the first microlens 90-A may form a curved surface together with the outside circumferential surface of the protruded portion P1 of the planarization layer 80. For example, the upper portion P2 of the first microlens 90-A and the protruded portion P1 of the planarization layer 80 may form one semi-spherical convex lens. A height of a peak portion of the first microlens 90-A may be the same as a height of a peak portion of the second microlens 90-B, but the invention is not limited as such, and the peak portions of adjacent microlenses may have different heights.

As has been described, since the lowest edge of the second microlens 90-B is not in contact with the upper portion P2 of the first microlens 90-A, but is in contact with the side of the protruded portion P1 of the planarization layer 80, which forms the lower portion of the first microlens 90-A, distortion of a radius of curvature of the microlens that may take place due to the overlap of adjacent microlenses can be prevented. Thus, embodiments of the present invention improve reliability of the image sensor 100 by preventing the distortion of the radius of the curvature of the microlens 90 from taking place.

FIGS. 3 to 10 illustrate the steps of an exemplary method for fabricating an image sensor in accordance with embodiments of the present invention.

Figure 3:
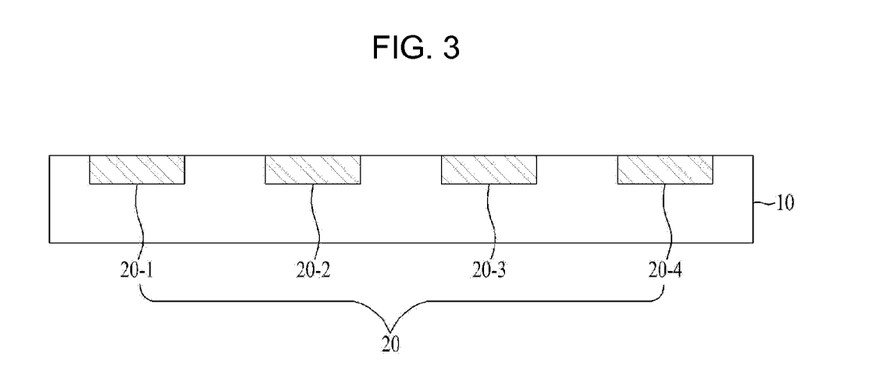
FIGS. 3 to 10 illustrate exemplary structures formed during the steps of a method for fabricating an image sensor in accordance with an exemplary embodiment of the present invention.

Referring to FIG. 3, one or more photodiodes 20 (e.g., 20-1, 20-2, 20-3, 20-4, etc.) are formed in a semiconductor substrate 10 (e.g., a silicon substrate), which is divided into a plurality of unit pixel regions S11 to Snm (where, n and m are natural numbers larger than 1; see, e.g., FIG. 12). The photodiode(s) 20 may be formed in the semiconductor substrate 10 corresponding to each of the plurality of unit pixel regions S11 to Snm (where, n and m are natural numbers larger than 1).

For example, in one embodiment, n-type impurity is injected into a p-type semiconductor substrate 10 to form a pn junction. Thus, the photodiodes 20 can be formed corresponding to the unit pixel region S11 to Snm, shown in FIG. 12 (where, n and m are natural numbers larger than 1).

In some embodiments, the photodiodes 20 can be formed using an epitaxial process. For example, silicon, which may further include a p-type dopant such as phosphorous, may be epitaxially grown on a p++ type semiconductor substrate 10 to form a p− type epitaxial layer (not shown in the figures). In exemplary embodiments, a single-crystalline silicon substrate can be used as the semiconductor substrate 10. The photodiodes 20 can be formed in a surface of the semiconductor substrate 10 by lightly doping the active area of the semiconductor substrate 10 by ion implantation (e.g., first with a light concentration of n-type dopant, then with a medium concentration of p-type dopant at a shallower depth than the n-type dopant).

Then, an isolation film (not shown) may be formed by STI (Shallow Trench Isolation) or LOCOS (Local Oxidation of Silicon) to form an isolation region and an active region of the semiconductor substrate 10. In some embodiments, the order of formation of the photodiodes 20 and the isolation region (not shown) may be reversed.

Figure 4:
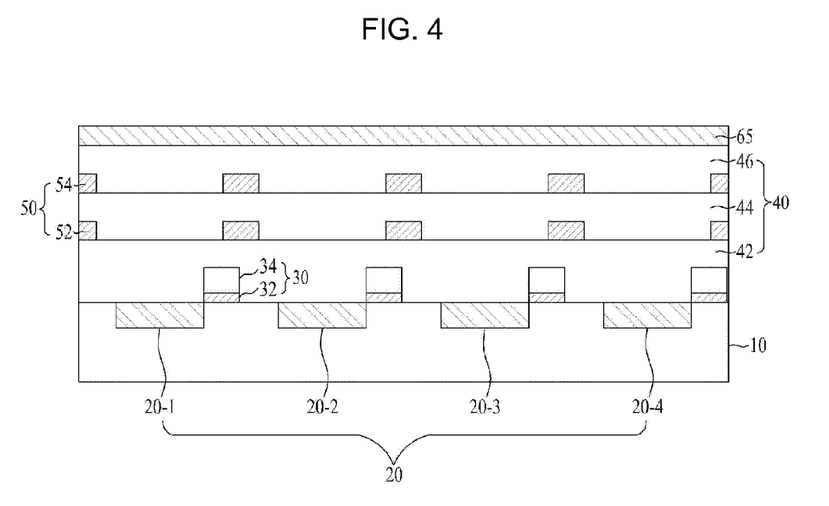

Next, referring to FIG. 4, a gate insulating film 32 and a conductive layer 34 (e.g., a silicon layer, etc.) are formed on the semiconductor substrate 10 having the photodiodes 20 formed thereon. The gate insulating film 32 and the conductive layer 34 may comprise any suitable material described herein, and may be formed by thermal oxidation, or chemical vapor deposition in succession, and selective etching (e.g., anisotropic, wet etching, dry etching, etc.) to form a gate electrode 30. In this instance, the gate electrode 30 may be a gate electrode of at least one of transistors (see, e.g., Sx, Dx, Rx, and Tx shown in FIG. 11) of the unit pixel. Then, in some embodiments, impurity ions may be injected into the semiconductor substrate 20 to form source and drain regions (not shown) adjacent to the gate electrode 30.

An interlayer insulating film 40 may then be formed on the semiconductor substrate 10 having the gate electrode 30 formed thereon to, which may contain a wiring layer 50. The interlayer insulating film 40 may be formed using an oxide (e.g., silicon dioxide), a nitride (e.g., silicon nitride), or a combination thereof (e.g., a nitride-on-oxide bilayer, or an oxide-nitride-oxide stack), or any other suitable insulating material known in the art.

For example, in exemplary embodiments, a first interlayer insulating film 42 may be formed on the semiconductor substrate 10 having the gate electrode 30 formed thereon. In this instance, the first interlayer insulating film 42 may be a PMD (Pre Metal Dielectric) in embodiments in which the first interlayer insulating film 42 is formed before the wiring layer 50.

A first wiring layer 52 may be formed on or in the first interlayer insulating film 42. In some variations, a second interlayer insulating film 44 may be formed on the first interlayer insulating film 42 having the first wiring layer 52 formed thereon. In such embodiments, a second wiring layer 54 may be formed on or in the second interlayer insulating film 44, and a third interlayer insulating film 46 may be formed on the second interlayer insulating film 44 having the second wiring layer 54 formed thereon. The first wiring layer 52 and the second wiring layer 54 may be a conductive layer as previously described herein, for example, a metal layer.

In some embodiments, the interlayer insulating film 40 (e.g., including first, second, and/or third interlayer insulating films 42, 44, and 46, respectively) may be formed by chemical vapor deposition (CVD), which may be plasma-assisted, plasma-enhanced, or high density plasma [HDP] CVD, or any other suitable method known in the art. The first, second, and/or third interlayer insulating films 42, 44, and 46 may be formed from the same material(s) and/or may be formed to have the same thickness(es). Also, each of the first, second, and/or third interlayer insulating films 42, 44, and 46 may be formed as a single layer or a plurality of layers (e.g., silicon nitride, silicon dioxide on silicon nitride, a silicon dioxide/fluorosilicate glass/silicon dioxide stack, etc.).

The wiring layer 50 (e.g., including first and second wiring layers 52 and 54, respectively) may be manufactured by depositing a conductive material known in the art (e.g., tungsten, doped silicon, aluminum, copper, metal alloys, silicides, etc.). For example, in some exemplary embodiments, the wiring layer 50 may be made by depositing at least one material selected from the group consisting of Ti, TiN, Al, Ta, TaN, W, and combinations, alloys, and conductive compounds thereof through physical vapor deposition (PVD), chemical vapor deposition (CVD), or any other suitable method known in the art. In some embodiments, the wiring layer 50 may comprise aluminum or an aluminum alloy (e.g., Al with up to 4 wt. % Cu, up to 2 wt. % Ti, and/or up to 1 wt. % Si), and may be deposited by sputtering on a conventional adhesion and/or barrier layer (e.g., Ti and/or TiN, such as a TiN-on-Ti bilayer). In still other embodiments, the wiring layer 50 may be formed by a single or a dual damascene process.

Next, after forming the interlayer insulating film 40 and the wiring layer(s) 50, a passivation layer 65 may be formed on the interlayer insulating film 40. In some embodiments, the passivation layer may be formed by depositing one or more insulating materials (e.g., a silicon nitride, $SiO_2$ or silicon rich oxide [SRO], a fluorosilicate glass [FSG], a TEOS-based oxide, an undoped silicate glass [USG], and/or any other insulating material known in the art) by CVD, followed by a planarization process. However, the method of forming the passivation layer is not limited as such, and the passivation layer may be formed using any other suitable method known in the art.

Figure 5:
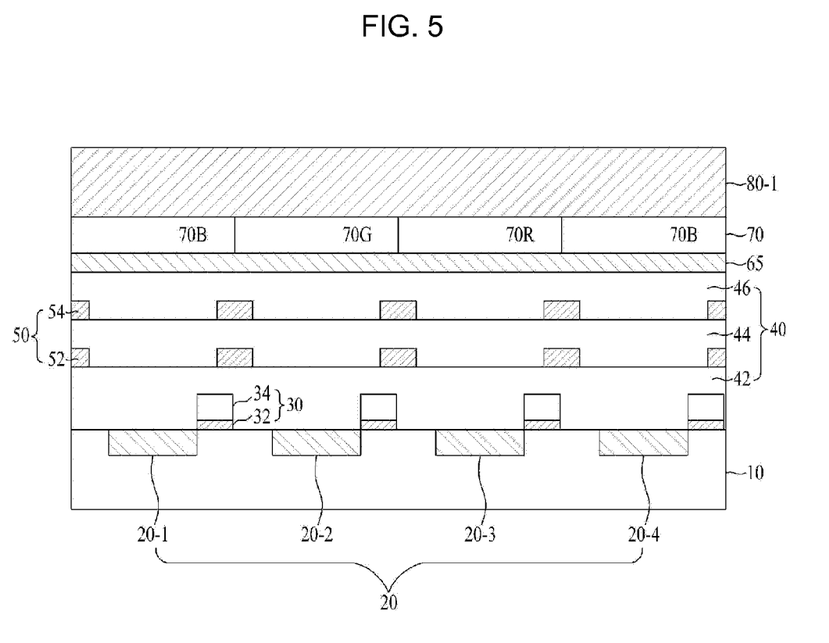

Referring now to FIG. 5, a color filter array 70 is formed on the passivation layer 65. In exemplary embodiments, the color filter array 70 includes at least a blue color filter 70B, a green color filter 70G, and a red color filter 70R, and may comprise a single layer. Although FIG. 5 illustrates the color filters having the same thickness, the present invention is not limited to this, and the color filters 70B, 70G, and 70R may have thicknesses different from one another.

Any one of the blue color filter 70B, the green color filter 70G, and the red color filter 70R may be formed to correspond to any one of the unit pixel regions S11 to Snm (FIG. 12). In exemplary embodiments, a photosensitive color resin is coated on the passivation layer 65, and subjected to exposure and development to form the color filter. The above-described process may be repeated to form each of the blue color filter 70B, the green color filter 70G, and the red color filter 70R, and thus form the color filter array 70.

Referring still to FIG. 5, a planarization layer 80-1 is formed on the color filter array 70. For example, in one embodiment, a silicon nitride film is deposited on the color filter array 70 to form the planarization layer 80-1. In other embodiments, the planarization layer 80-1 may be formed by depositing silicon dioxide (e.g., a CVD TEOS-based oxide as described herein or a spin-on glass [SOG]), a polyimide, or an organic passivation material, which after deposition may be planarized by chemical mechanical polishing (CMP). The planarization layer 80-1 may be formed to have a thickness of from about 1,000 Å to about 6,000 Å.

Figure 6:
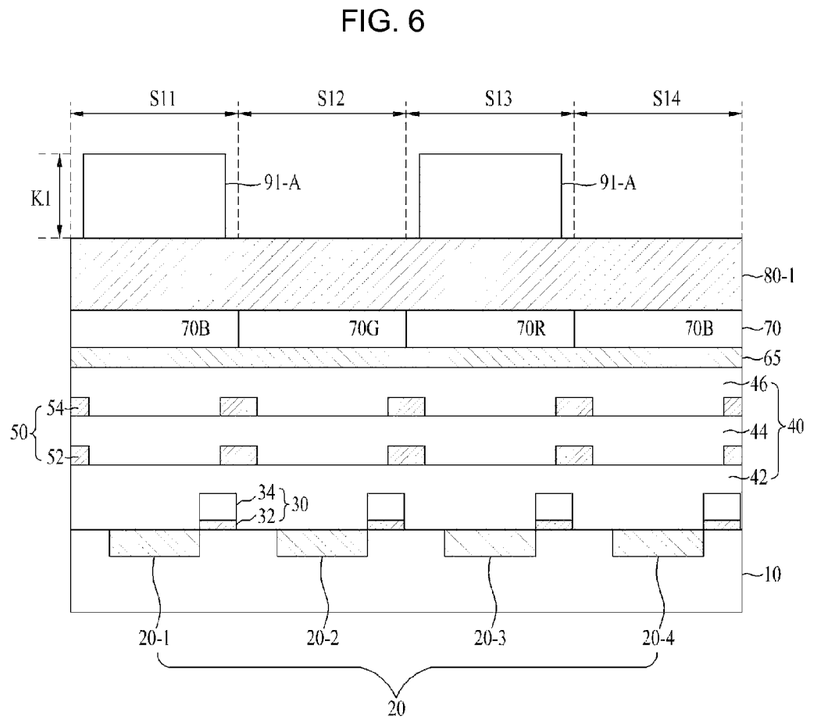

Referring now to FIG. 6, a photoresist or other microlens material (not shown) is coated on the planarization layer 80-1, and exposure and development processes are performed on the photoresist material to form a first photoresist pattern 91-A on the planarization layer 80-1.

The first photoresist pattern 91-A may be formed on one or more regions of the planarization layer 80-1 which falls under any of the adjacent two unit pixels. For example, the first photoresist pattern 91-A may be formed under unit pixel S11 adjacent to unit pixel S12. The first photoresist pattern 91-A may also be formed under unit pixel S13 adjacent to S14, as shown in FIG. 5. The first photoresist pattern 91-A may be formed to have a first thickness K1. In this instance, the adjacent two unit pixel regions may be in a column or a row of a matrix (see, e.g., FIG. 12).

Figure 7:
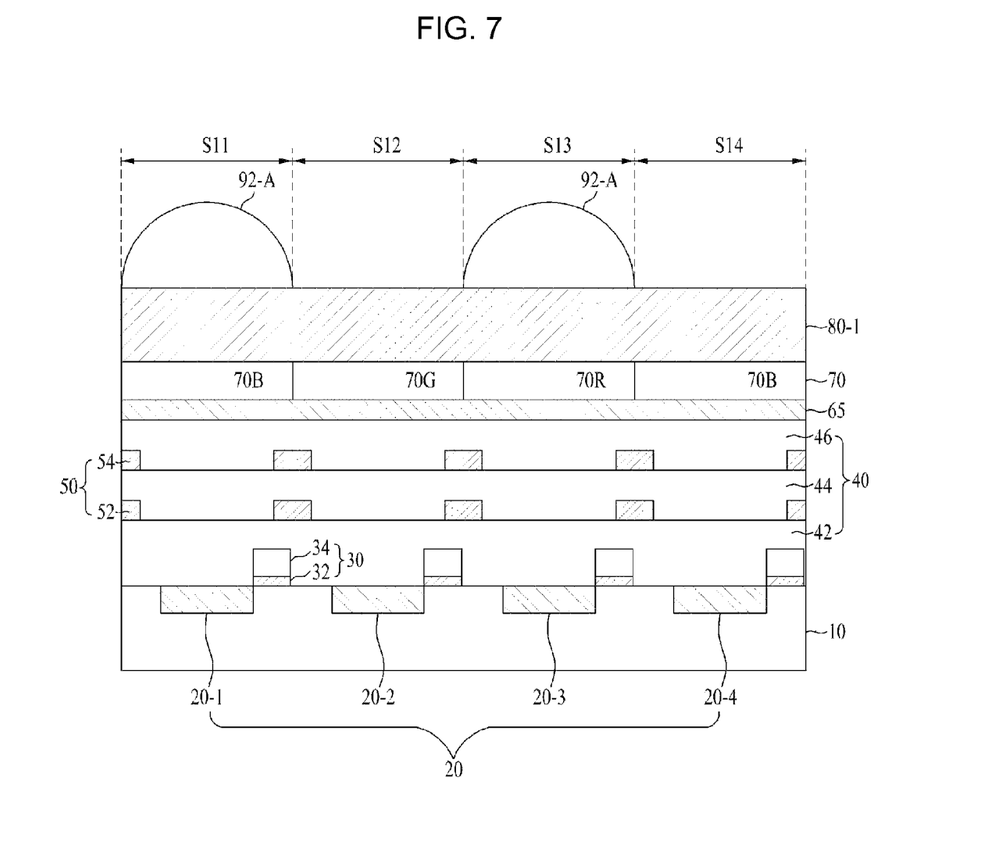

Next, referring to FIG. 7, the first photoresist pattern 91-A is subjected to thermal reflow, to form a reflowed first photoresist pattern 92-A. In some exemplary embodiments, the reflowed first photoresist pattern 92-A may have a curved outside circumferential surface.

The thermal reflow process may include reflow and setting of the first photoresist pattern 92-A. In this instance, the reflowed first photoresist pattern 92-A is formed on a first region (for example, S11) of the planarization layer 80-1 which falls under any one of two adjacent unit pixel regions (for example, S11 and S12), and the second region (for example, S12) of the planarization layer 80 which falls under the other one of the two adjacent unit pixel regions (for example, S11 and S12) may be exposed from the reflowed first photoresist pattern 92-A.

Figure 8:
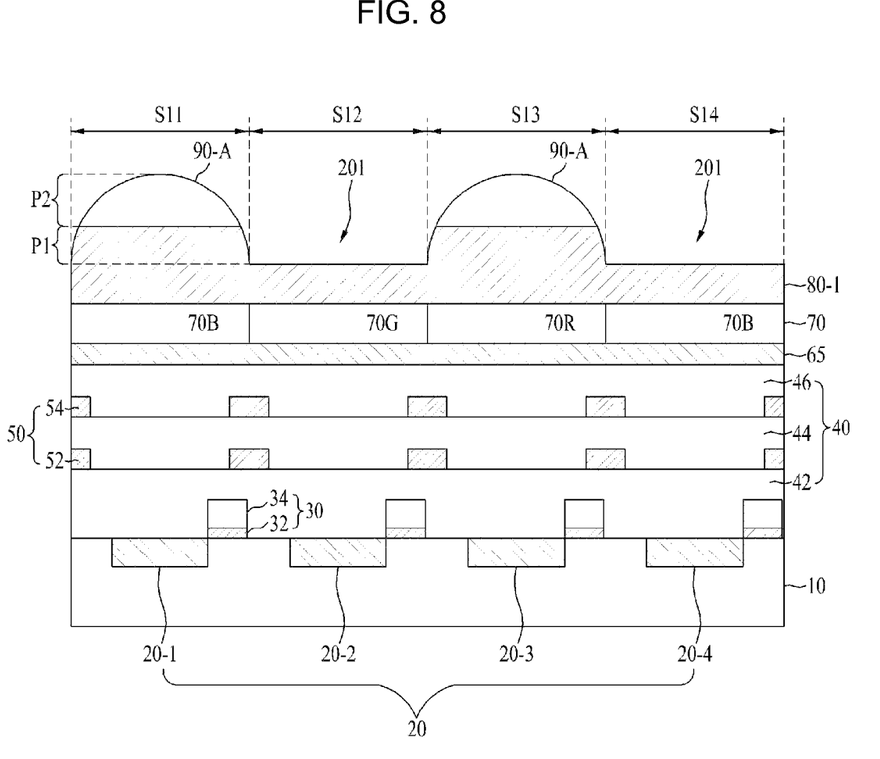

Next, referring to FIG. 8, the reflowed first photoresist pattern 92-A and the exposed planarization layer 80-1 are etched to form a first microlens 90-A on the first region (for example, S11) of the planarization layer 80-1 positioned at any one of the two adjacent unit pixel regions (for example, S11 and S12), and a recess 201 in the second region (for example, S12) of the planarization layer 80-1 positioned at the other one of the two adjacent unit pixel regions (for example, S11 and S12). In exemplary embodiments, the recess 201 does not expose the color filter array 70.

As the reflowed first photoresist pattern 92-A and the planarization layer 80-1 are etched (e.g., partially), a first microlens 90-A having a fixed radius of curvature can be formed. That is, etching as previously described herein can form a protruded portion P1 at the first portion 80-A (see, e.g., FIG. 2) of the planarization layer 80 under the reflowed first photoresist pattern (92-A of FIG. 7), and the recess 201 at the second portion 80-B (see, e.g., FIG. 2) of the planarization layer 80-1 exposed from the reflowed first photoresist pattern 92-A.

Referring again to FIG. 7, since the reflowed first photoresist pattern 92-A has a curved outside circumferential surface, etching can form the curved outside circumferential surface of the protruded portion of the planarization layer 80-1 under the reflowed first photoresist pattern 92-A.

That is, by etching a portion of the planarization layer 80-1 using the reflowed first photoresist pattern 92-A as a mask, the protruded portion P1 having the curved outside circumferential surface can be formed at the planarization layer 80-1 under the reflowed first photoresist pattern 92-A. Consequently, the protruded portion P1 can form the first microlens 90-A together with the reflowed first photoresist pattern 92-A. Therefore, the outside circumferential surfaces of the protruded portion P1 and the reflowed first photoresist pattern 92-A can form one curved surface.

For example, the etched protruded portion P1 of the planarization layer 80-1 and the reflowed first photoresist pattern 92-A can form one semi-spherical convex lens. In some embodiments, the etch rates of the reflowed first photoresist pattern 92-A and the etch rates of the planarization layer 80-1 may be the same, but the etch rates are not limited to this. On the contrary, in other embodiments, the etch rates of the reflowed first photoresist pattern 92-A and the planarization layer 80-1 may be different.

The etch chemistry for etching the reflowed first photoresist pattern and the exposed planarization layer may be selective or non-selective, and the depth to which the recess in the planarization layer is etched may be controlled by controlling the length of time that reflowed first photoresist pattern and the exposed planarization layer are etched. In some embodiments, the etching process may comprise an $O_2$ plasma etch back having a direction (for example, a direction facing from an upper side to a lower side), and thus a radius of curvature of the first microlens 90-A can be controlled by controlling surface roughness according to the extent of etching. For example, in some embodiments, the etch gas used in the $O_2$ plasma etch back may include $CF_4$ and $O_2$.

Specifically, etching may comprise a reactive ion etching method, using a (hydro)fluorocarbon (e.g., $CF_4$, $CHF_3$, $C_2F_6$, $C_2HF_5$, $C_2H_2F_4$, $C_4F_8$, a combination thereof, etc.), a noble gas (e.g., He, Ne, Ar, Kr, etc.), and an oxygen source (e.g., $O_2$, $O_3$, $H_2O_2$, etc.). In such embodiments, etching conditions may include supplying the (hydro)fluorocarbon (e.g., $CF_4$), noble gas (e.g., Ar), and oxygen source (e.g., $O_2$) in a (flow rate) ratio of about 16:32:1. At this point, a supply rate of $CF_4$ may be about 70-90 sccm, a supply rate of Ar may be about 140-180 sccm, and a supply rate of $O_2$ may be about 4-6 sccm.

Figure 9:
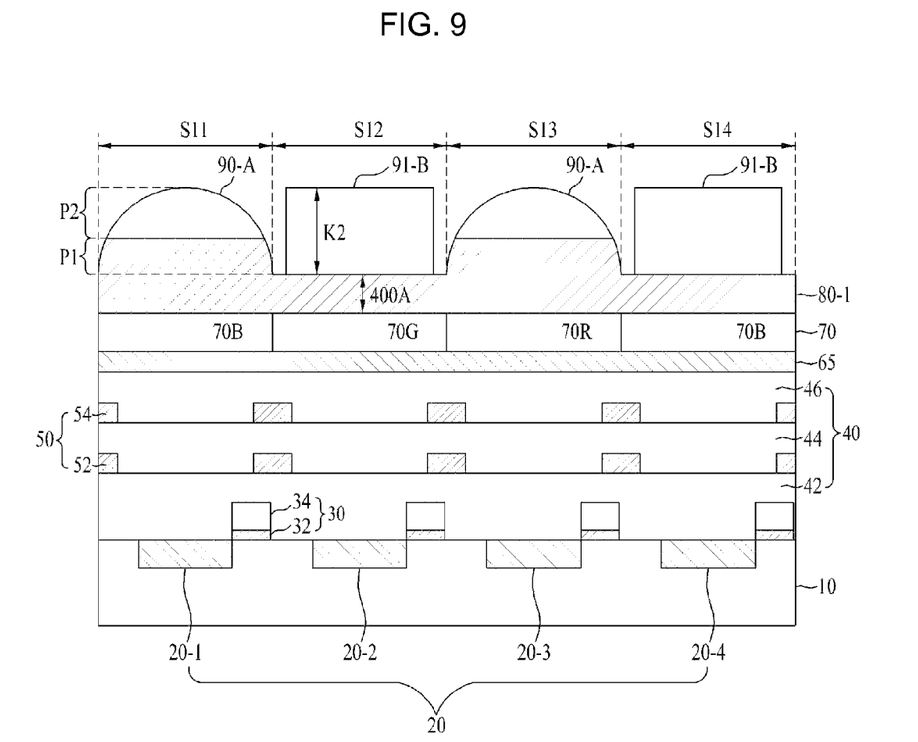

Referring now to FIG. 9, a second photoresist pattern 91-B is formed in the recess 201 at the second region of the planarization layer 80-1. In some exemplary embodiments, the second photoresist pattern 91-B may have a thickness K2 different from a thickness K1 of the first photoresist pattern 91-A. For example, the second photoresist pattern 91-B may have a thickness K2 that is greater than the thickness K1 of the first photoresist pattern 91-A, shown in FIG. 6 (e.g., K2>K1). The second photoresist pattern 91-B may be spaced from the outside circumferential surface of the protruded portion P1, as shown in FIG. 9.

Figure 10:
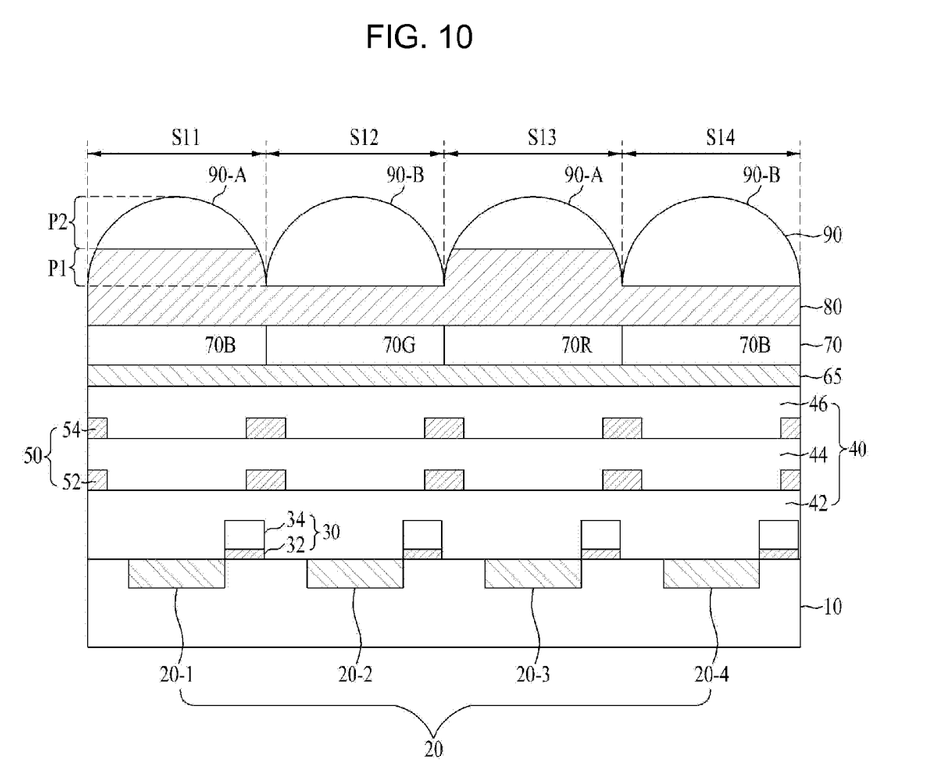

Next, referring to FIG. 10, the second photoresist pattern 91-B is subjected to thermal reflow as described herein to form a second microlens 90-B.

Since the second photoresist pattern 91-B is reflowed within the recess 201, a lowest edge of the second microlens 90-B is neither overlapped nor in contact with the outside circumferential surface of the upper side of the first microlens 90-A. The thermal reflow may cause the lowest edge of the second microlens 90-B to be in contact with the outside circumferential surface of the protruded portion P1 of the first portion 80-A (see, e.g., FIG. 2) of the planarization layer 80.

In some embodiments, since the planarization layer 80 and the second microlens 90-B may be formed of materials different from each other, the planarization layer 80 and the second microlens 90-B may have surface roughnesses different from each other. Consequently, even if the second photoresist pattern 91-B is subjected to thermal reflow, since the second photoresist pattern 91-B being reflowed is suppressed to flow to the upper portion P2 of the first photoresist pattern 91-A along the outside circumferential surface of the planarization layer 80, the second photoresist pattern 91-B is in contact therewith, and the overlap between adjacent microlenses can be prevented.

Embodiments of the present invention can prevent the microlens from distorting or becoming asymmetric due to overlap between adjacent microlenses. Therefore, the embodiments described herein can improve reliability of the image sensor.

As has been described, embodiments of the present invention can improve reliability of the image sensor by preventing the microlens from distorting or becoming asymmetric by overlap of adjacent microlenses.

Characteristics, structures, features, effects, and so on described in the above embodiments are included or directed to at least one embodiment, but are not limited to only one embodiment invariably. Furthermore, it is apparent that the characteristics, features, the structures, the effects, and so on described in the embodiments can be combined, or modified with other embodiments by persons skilled in this field of art. Therefore, it is understood that such combinations and/or modification are included within the scope of the present invention.

What is claimed is:

1. An image sensor comprising:
    a plurality of photodiodes in a semiconductor substrate;
    a color filter array over the plurality of photodiodes; and
    a plurality of microlenses on the color filter array,
    wherein a first microlens of two adjacent ones of the plurality of microlenses includes an upper portion and a lower portion, and the lower portion of the first microlens comprises a material different from a material of the upper portion of the first microlens.

2. The image sensor as claimed in claim 1, wherein the lower portion of the first microlens comprises a material different from a material of a second microlens of the two adjacent ones of the plurality of microlenses.

3. The image sensor as claimed in claim 2, wherein the upper portion of the first microlens comprises a same material as the second microlens.

4. The image sensor as claimed in claim 2, wherein the first microlens has a boundary surface between the upper portion and the lower portion, wherein the boundary surface is higher than a lowermost surface of the second microlens.

5. The image sensor as claimed in claim 2, wherein the second microlens has a lowest edge in contact with the lower portion of the first microlens.

6. The image sensor as claimed in claim 2, further comprising a planarization layer between the color filter array and the microlenses.

7. The image sensor as claimed in claim 6, wherein the lower portion of the first microlens comprises a portion of the planarization layer.

8. The image sensor as claimed in claim 7, wherein the planarization layer includes a protruded portion and a recessed portion, wherein the protruded portion forms the lower portion of the first microlens, and the recessed portion has the second microlens thereon.

9. The image sensor as claimed in claim 8, wherein the recessed portion has a thickness of about 0.25 μm to 0.35 μm, and the protruded portion has a thickness of about 0.35 μm to 0.55 μm.

10. The image sensor as claimed in claim 8, wherein the protruded portion has a curved outside circumferential surface.

11. The image sensor as claimed in claim 8, wherein the second microlens has a lowest edge in contact with the outside circumferential surface of the protruded portion.

12. The image sensor as claimed in claim 6, wherein the planarization layer comprises a material different from a material of the second microlens.

13. The image sensor as claimed in claim 1, further comprising:
    an insulating film between the semiconductor substrate and the color filter array;
    a wiring layer in the insulating film; and
    a passivation layer between the insulating film and the color filter array.

* * * * *